United States Patent
Kennedy

[11] Patent Number: 5,883,519
[45] Date of Patent: *Mar. 16, 1999

[54] DEFLECTION DEVICE

[75] Inventor: James D. Kennedy, Alpine, Calif.

[73] Assignee: Kinetic Probe, LLC, Poway, Calif.

[*] Notice: This patent issued on a continued prosecution application filed under 37 CFR 1.53(d), and is subject to the twenty year patent term provisions of 35 U.S.C. 154(a)(2).

[21] Appl. No.: 612,624

[22] Filed: Feb. 23, 1996

[51] Int. Cl.$^6$ .................................................. G01R 31/02
[52] U.S. Cl. ........................... 324/761; 324/754; 324/762
[58] Field of Search .................................. 324/754, 761, 324/762; 330/332, 8.6; 364/550

[56] References Cited

U.S. PATENT DOCUMENTS

| | | | |
|---|---|---|---|
| 3,622,815 | 11/1971 | Schafft | 310/8.6 |
| 3,812,311 | 5/1974 | Kvaternik | 324/761 |
| 3,851,249 | 11/1974 | Roch | 324/754 |
| 4,123,706 | 10/1978 | Roch | 324/754 |
| 4,219,771 | 8/1980 | Reid et al. | 324/754 |
| 4,618,821 | 10/1986 | Lenz | 324/754 |
| 4,755,706 | 7/1988 | Harnden, Jr. et al. | 310/332 |
| 4,811,246 | 3/1989 | Fitzgerald, Jr. et al. | 364/550 |
| 4,916,349 | 4/1990 | Kornrumpf | 310/332 |
| 4,973,903 | 11/1990 | Schemmel | 324/754 |
| 5,128,612 | 7/1992 | Aton et al. | 324/754 |
| 5,291,129 | 3/1994 | Kazama | 324/757 |
| 5,338,223 | 8/1994 | Melatti et al. | 439/482 |
| 5,357,192 | 10/1994 | Van Zee et al. | 324/758 |
| 5,369,358 | 11/1994 | Metzger et al. | 324/754 |
| 5,436,571 | 7/1995 | Karasawa | 324/765 |
| 5,469,073 | 11/1995 | Liebman et al. | 324/757 |

*Primary Examiner*—Josie Ballato
*Assistant Examiner*—Russell M. Kobert
*Attorney, Agent, or Firm*—Knobbe, Martens, OLson & Bear, LLP

[57] ABSTRACT

A deflection device having a longitudinal configuration is fixed at one of its ends to a base supporting structure and is responsive to a first electrical signal from a control network to move the other of its ends in a first direction. The arm assembly can include at least one piezoelectric crystal having characteristics for deflecting in response to the first signal and for oscillating in response to abrupt changes in the magnitude of the first signal. This deflection device is particularly adapted for use as a probe for testing electrical circuits having a plurality of contact points coated with an insulating material. A probe tip can be disposed in proximity to the second end of the device so that the deflection of the crystal provides the tip with kinetic energy for penetrating the insulating material to provide electrical contact with one of the contact points. A second signal can then be introduced to the probe tip to test the electrical circuit. A pair of piezoelectric crystals spaced by a conductive material can provide a capacitance in the control network for shaping the first signal to inhibit the oscillations of the crystals.

8 Claims, 3 Drawing Sheets

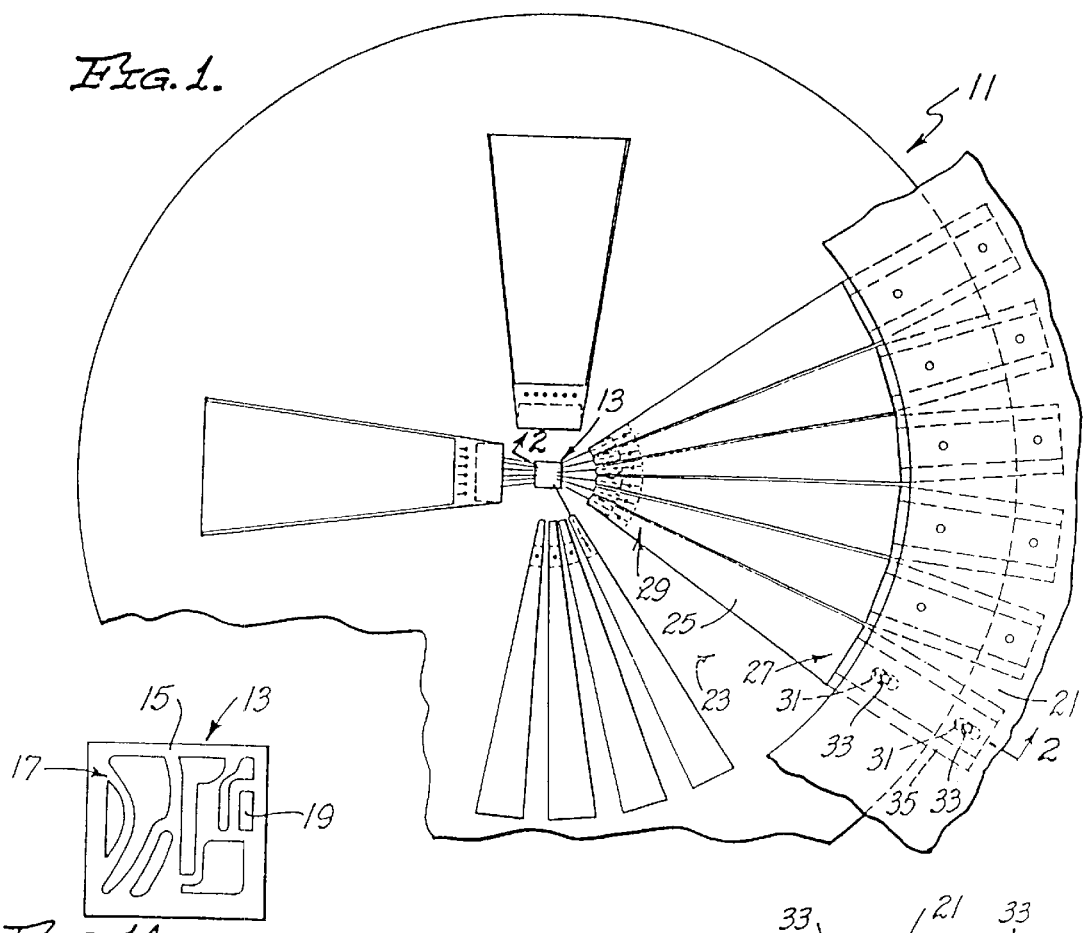
FIG. 1.
FIG. 1A.
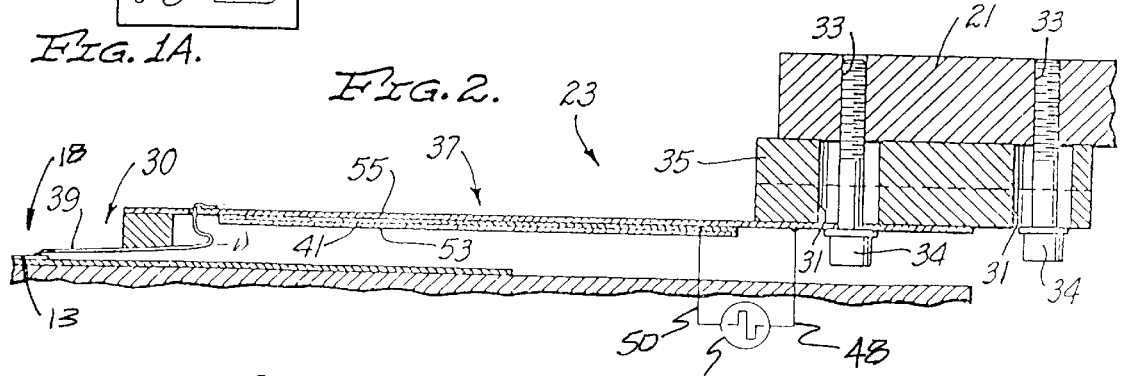
FIG. 2.
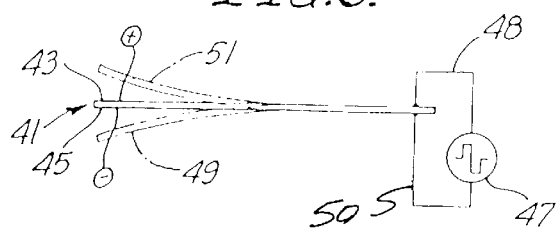
FIG. 3.
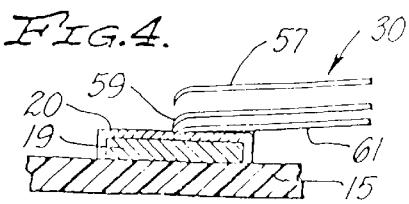
FIG. 4.

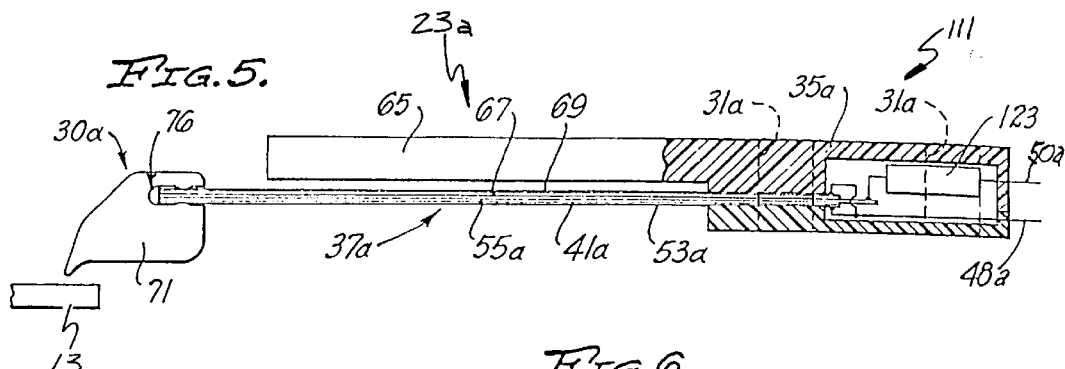
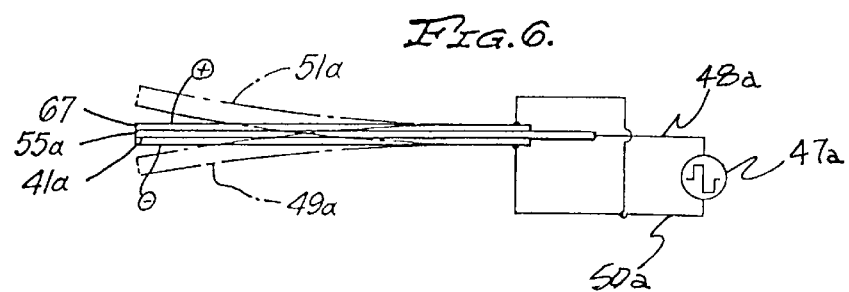
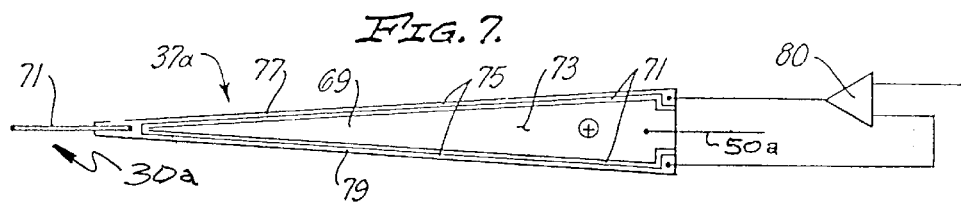
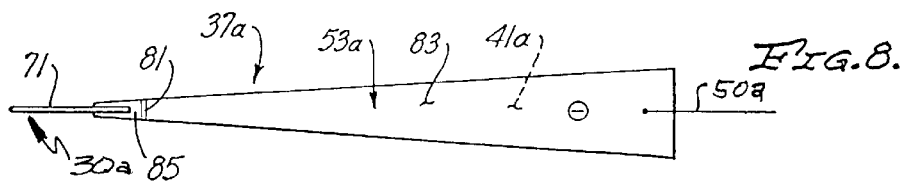

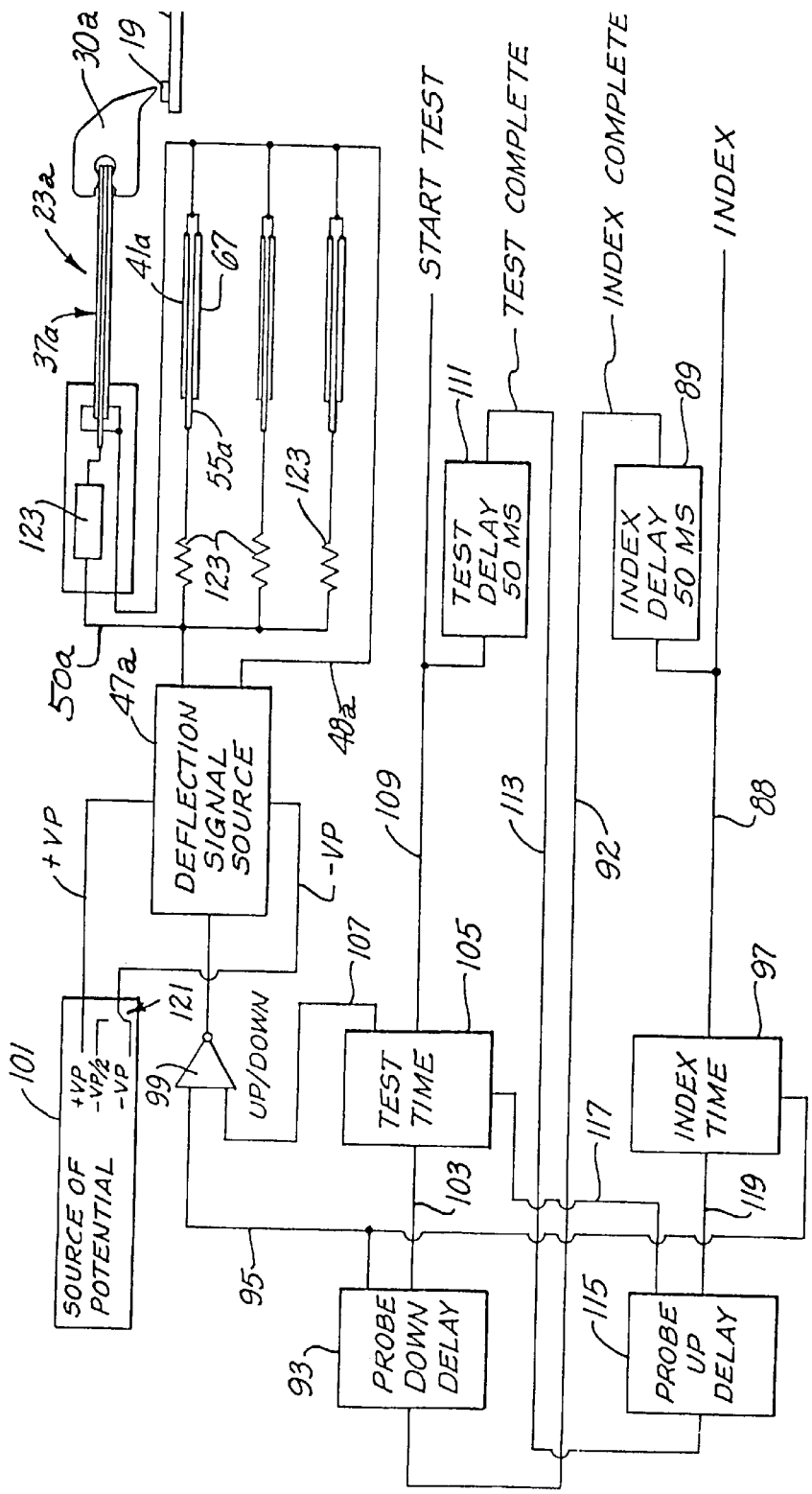

DEFLECTION DEVICE

TECHNICAL FIELD

This invention relates generally to deflection devices and more specifically to the use of piezoelectric crystals in a probe for testing electrical circuits even if coated with an oxide type insulating material.

BACKGROUND ART

To maintain quality in the manufacture of electrical circuits, it has always been desirable to perform various functional and parametric tests on the circuits prior to their use or sale. This has become increasingly difficult with the advent of photographic processes for manufacturing integrated circuits and their associated electrical contact. In this regard, such integrated circuit contacts, which are typically formed with aluminum, on wafers of silicon substrate material, are very small and tightly spaced. In fact, points on the circuit which would typically be contacted to perform the various tests may have dimensions of less than 2 mils. To compound the problems associated with providing electrical contact with these points, the aluminum material of the contact points has oxidized to provide an insulated coating. It has been desirable to penetrate this oxide coating in order to provide an adequate electrical contact with the particular contact point.

Probes of the prior art have typically been held stationary while the integrated circuit chips have been moved to provide electrical contact between a particular one of the contact points and the tip of the probe. The relative movement between the probe tip and the contact point has been slow so that the testing apparatus have relied upon a relatively constant force, such as ten grams to penetrate the oxide coating and provide contact with the contact point. The ten grams of force has been sufficient in some cases to penetrate the oxide coating but the same ten grams of force has ultimately been exerted upon the contact point so that the point has been cut or otherwise deleteriously affected by the test. For this reason, reprobing of a particular integrated circuit has not been advisable. Some of the probes have been provided with a tip which has been moved laterally across the oxide coating to facilitate the penetration thereof. This movement has also adversely affected the integrated circuit by scratching the particular contact point.

Therefore, it would be highly desirable to have a new and improved probe, which is relatively inexpensive to manufacture, and which develops a sufficient force to break through a thick layer of oxide coating and to dissipate it from the exposed electrical contact.

DISCLOSURE OF INVENTION

In the present invention, a probe for testing an electrical circuit is provided with a deflection device longitudinal in configuration and fixed at one end thereof to a supporting structure. A probe tip is fixed to the other end of the deflection device and disposed in proximity to a particular contact point of the electrical circuit under test. The deflection device is responsive to a first electrical signal to move the probe tip at a relatively high velocity in the direction of the contact point. Thus, the deflection device provides the probe tip with kinetic energy for penetrating the oxide coating to provide electrical contact with the particular contact point. The force of the probe tip upon the oxide coating is particularly high relative to the force of the probe tip upon the contact point. This facilitates the penetration of the oxide coating by the probe tip while significantly reducing the static force exerted upon the particular contact point. Thus, the deflection device of the present invention permits testing of the electrical circuit without adversely affecting the contact points. This is particularly desirable since a given electrical circuit can be reprobed if necessary.

The deflection device typically includes at least one piezoelectric crystal having first and second major surfaces and adapted to receive a first signal of a first polarity can be introduced to the first major surfaces of the crystal to provide a deflection in the direction of a contact point. A first signal of a second, opposite polarity can deflect the crystal in a direction away from the contact point. In this manner, crystals can be coupled in parallel so both crystals aid in the probe reflecting both away from and in deflection of the contact surface.

A layer of conductive material can be coated on the first major surface of the crystal and electrically separated into a first portion for receiving the first signal, and a second portion for receiving a second signal to energize the probe tip in accordance with the test procedure. The second signal can be provided by an operational amplifier incorporating a high impedance feedback loop to provide a constant voltage at the probe tip.

The probe tip may tend to bounce on the particular contact point in response to abrupt changes in the magnitude of the first signal. Therefore, it may be desirable to shape the first signal to avoid the abrupt changes. In a preferred embodiment of the present invention, a pair of piezoelectric crystals are separated by a conductive material in the deflection device and the crystals provide a capacitance in the control network to inhibit abrupt changes in the magnitude of the first signal. This embodiment, including a pair of crystals, is also less susceptible to warping.

These and other features and advantages of the present invention will become more apparent with a description of preferred embodiments taken in conjunction with the associated drawings.

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein:

FIG. 1 is a plan view of an electrical circuit testing apparatus including a plurality of probes which is constructed in accordance with the present invention, illustrating each probe and associate probe tip extending to contact an integrated circuit chip undergoing test;

FIG. 1a is a plan view of the integrated circuit chip illustrated in FIG. 1;

FIG. 2 is a partial side elevational view of the testing apparatus of FIG. 1 taken substantially on line 2—2 thereof, illustrating one embodiment of the probe including a deflection device having one piezoelectric crystal;

FIG. 3 is an elevational view of a piezoelectric crystal illustrating the deflection characteristics thereof in response to an applied signal;

FIG. 4 is a side elevational view of a probe tip illustrating deflected positions thereof relative to a contact point;

FIG. 5 is a side elevational view of another electrical circuit testing apparatus constructed in accordance with the present invention illustrating a further embodiment of a probe which includes a deflection device having a pair of piezoelectric crystals;

FIG. 6 is an elevational view of the deflection device shown in FIG. 5 illustrating the deflection characteristics thereof in response to an applied signal;

FIG. 7 is a top view of the deflection device of FIG. 5 which illustrates means for energizing the probe tip;

FIG. 8 is a bottom view of the embodiment of the deflection device illustrated in FIG. 5;

FIG. 9 is a graph illustrating a current pulse having a preferred shape for energizing the deflection device of the present invention; and FIG. 10 is a block diagram of a controller for energizing the deflection device of the present invention.

BEST MODE FOR CARRYING OUT THE INVENTION

An apparatus for testing electrical circuits is shown generally in FIG. 1 an designated by the reference numeral 11. The particular electrical circuit undergoing test can be of the type commonly associated with integrated circuit chips, such as a chip 13. The chip 13, shown best in FIG. 1a, typically include a substrate 15 having an electrical circuit 17 etched thereon. The circuit 17 will typically be defined by a conductive material formed into a plurality of lines and patches or pads most of which will be associated with at least one contact point 19.

To test such a circuit 17 it is desirable that an electrical contact be provided with particular ones of the contact points, such as the point 19. Then, the particular contact point 19 can be energized to perform various functional and parametric tests to determine the quality of the circuit 17. These tests can be performed with the aid of a probe, such as the probe 23, which provides electrical contact with the particular point 19. Then the circuit 17 can be energized by means (not shown) or alternately through the probe 23 and the point 19 with various voltages and currents in accordance with a test procedure.

The provision of the electrical contact between the probe 23 and the point 19 is of course particularly difficult if the circuit 17 is of minute size. For example, the chip 13 may have dimensions as small as 1/10 inch square. On such a chip 13, the contact points 19 may have a maximum dimension of less than 2 mils. To further compound the problems associated with providing an electrical contact with the point 19, the circuit 17 typically includes an aluminum material which oxidizes to form a coating 20 over the circuit 17. The coating 20 is shown best in FIG. 4. Since this oxide coating 20 has insulating characteristics, it is desirable to penetrate the coating 20 with the probe 23 to provide adequate electrical contact with the points 19.

The testing apparatus 11 generally comprises a base member 21 having at least one probe mounted thereto, such as the probe 23. In this regard, the base 21 supports the probe 23 from one of its ends in a cantilevered manner and in proper alignment relative to the electrical contact 19. Since it may be desirable to perform several tests simultaneously, and since a given test may involve the use of more than one probe, several of the probes 23 will typically be fixed to a single base 21.

The probe 23 is longitudinal in configuration and defined by a first end 27 and a second end 29. The first end 27 of the probe 23 can be provided with a plurality of oversized holes 31 which can be aligned with associated threaded holes 33 in the base 21. A plurality of screws 34 can then be passed through the oversized holes 31 to register with the holes 33 and maintain the fixed relationship on the probe 23 and base 21. In this manner, the probe 23 is adapted to be aligned so that the second end 29 of the probe 23 extends in close proximity relative to a particular contact point 19 of the circuit 17.

As best seen in FIG. 2, the probe 23 includes a supporting structure 35, portions of which define the oversized holes 31 and a deflection device 37. The deflection device 37, is fixed in a cantilevered manner to the supporting structure 35, and extend to support at least one probe tip 30 in close proximity of the associated contact point 19. The probe tip 30 can be a wire or whisker 39, such as that illustrated in FIG. 2.

As will be explained hereinafter, the deflection device 37 propels the probe tip 30 forcibly and rapidly toward the electrical contact 19 and subsequently away from the contact 17. In this regard, the probe tip 30 impacts the oxide coating 20 covering the electrical contact 19 forcibly and rapidly with a sufficient force to dissipate the oxide coating 20 from the electrical contact 19 enabling the probe tip 30 to engage mechanically and electrically the electrical contact 19 for electrical testing purposes.

The deflection device 37 includes at least one crystal 41 having piezoelectric characteristics for deflecting in response to an electrical signal. The crystal 41 can be relatively thin with a greater length than breadth to enhance its deflection characteristics along its length. Thus, as illustrated in FIG. 3, the crystal 41 can have a longitudinal planar configuration with a first major surface 43 and a second major surface 45. The signal for deflecting a crystal 41 can be provided by a deflection signal source 47 and can be impressed across the surfaces 43 and 45 through lines 48 and 50, respectively. The crystal 41 can be oriented so that a signal from the source 47 which provides the surface 43 with a positive potential relative to the surface 45 deflects the crystal 41 to a position 49 away from the surface 43. If the signal from the source 47 provides the surface 43 with a negative potential with respect to the surface 45, the crystal 41 can deflect to a position 51 away from the surface 45. With this orientation of the crystal 41, the surface 43 is typically designated with an encircled plus sign and the surface 45 is typically designated with an encircled minus sign.

To enhance the deflection characteristics of the crystal 41, it is desirable to impress the signals from the source 47 across a substantial area of the surfaces 43 and 45. Thus, a preferred embodiment of the deflection device 37 includes a thin layer 53 of metal, such as silver, coated on one of the surfaces 43 and 45. The other of the surfaces 43 and 45 will typically be maintained in contiguous relationship with a structural member 55 which can be formed from any conductive material, such as beryllium copper. The signal from the source 47 can then be impressed upon the layer 53 and the member 55 to energize the surfaces 43, 45 of the crystal 41.

The crystal 41 can be fixed to the structural member 55 by any suitable method. In a preferred method of manufacturing the deflection device 37, the surface 43 of the crystal 41 is coated with a layer of solderable material (not shown), such as copper. This layer is then soldered to the structural member 55, for example by inductive heating. In a like manner, the surface 45 is coated with a layer of solderable material (not shown) such as copper to enable the surface 45 to be soldered to the structural member 53.

The deflection of the crystal 41 is of particular interest to the present invention for, as noted, it provides the probe tip 30 with kinetic energy for penetrating and dislodging a portion of the oxide coating 20 disposed on the contact point 19. With reference to FIG. 4, it will be noted that the probe tip 30 is initially spaced in a cocked position 57 from the contact point 19 a given distance, such as a 20 mils distance in the cocked position. When the deflection device 37 is energized by a signal from the source 47, the crystal 41 deflects so that the probe tip 30 moves across the 20 mil distance in a time of only 50 microseconds. Thus, it is evident that when the probe tip 30 initially contacts the oxide coating 20 at a position 59, the tip 30 has a substantial velocity and therefore a high kinetic energy. This kinetic energy is substantially dissipated as the probe tip 30 penetrates the oxide coating 20 and comes into initial engagement with the contact point 19 at a position designated by reference numeral 61.

It is apparent that the velocity of the probe tip 30 at the position 61 is substantially reduced from that at the position 59. This can be accounted for by appreciating that the oxide coating 20 exerts a force upon the probe tip 30 which decelerates the probe tip 30 as it penetrates the coating 20. With a reduced velocity at the position 61, the probe tip 30 has a minimal kinetic energy. Therefore, the additional force exerted by the contact point 19 upon the tip 30, which is needed to decelerate the tip 30 to a zero velocity, is also minimal. Thus, the tip 30 can be brought to rest in mechanical and electrical contact with the point 19 without substantially penetrating or otherwise damaging structurally or degrading the point 19. This will be of particular advantage not only in preserving the integrity of the circuit 17 but also in permitting a reprobing of the chip 13 should subsequent testing be desirable.

If the magnitude of the signal provided by the source 47 is abruptly changed, the crystal 41 may oscillate so that the probe tip 30 bounces upon the contact point 19. Under these circumstances, the structural member 55 is additionally advantageous. Since the member 55 is fixed to the crystal 41 along the length thereof, it bends with and resists the deflection of the crystal 41. This resistance to bending of the member 55 has a dampening effect upon the oscillations of the crystal 41.

It is desirable that one end of the deflection device 37 be fixed to the supporting structure 35 with the other end of the device 37 free to support and deflect the probe tip 30. Although any or all of the layers comprising the laminate can be extended to contact the supporting structure 35, it may be desirable that the extended layers include the structural member 55 since this member 55 will typically be the strongest layer in the laminate. As noted in FIG. 2, the structural member 55 can be extended beneath the supporting structure 35 and provided with a hole similar in cross section to the enlarged holes 31. Then the screw 34 can force the member 55 against the supporting structure 35 and the supporting structure 35 against the base 21.

Considering now the operation of the testing apparatus 11 in greater detail with reference to FIGS. 1–4, the chip 13 is positioned on the base 21 at a test site 18 disposed thereon. One or more of the probes, such as the probe 23 is mounted to the base 21 via the screw 34 so that the probe tip 30 is aligned with and in close proximity to the electrical contact 19. The electrical source 47 is then connected to the structural members 53 and 55 via the conductors 50 and 48, respectively.

The probe tip 30 is then moved to its cocked position 57 by applying a positive charge to the structural member 55. In this regard, the crystal 41 responds to the electrical signal causing the surface 43 to go into tension and the surface 45 to go into compression to move the structural members 53 and 55 and the probe tip 30 away from the electrical contact 19 into the cocked position 57.

Next, after the probe 23 has come to rest in the cocked position 57, a negative charge is applied to the structural member 53 causing the surface 43 to go into compression and the surface 45 to go into tension which in turn causes the structural members 53 and 55 and the probe tip 30 to be accelerated rapidly in a direction toward the electrical contact. In this regard, a sufficient amount of kinetic energy is imparted to the probe tip 30 to enable it to penetrate and dislodge a substantial portion of the oxide coating 20 and thus to dissipate or clean away the coating 20. The oxide coating 20 exerts an opposing force against the probe tip 30 causing the kinetic energy in the probe 23 to be transferred rapidly as the probe tip 30 penetrates it. When the probe tip 30 comes into mechanical engagement with the electrical contact 19, such a sufficient amount of kinetic energy has been transferred to the coating 20 to enable the tip 30 to come into resting mechanical and electrical engagement with the electrical contact 19 without causing any substantial structural damage to the contact 19.

Once the probe 23 has made electrical contact with the contact 19, the various electrical tests may be performed according to conventional test procedures. When the testing is completed, the negative charge is removed from the probe 23 allowing it to come to a neutral resting position neither in compression nor tension as indicated at 41 in FIG. 3.

From the foregoing, those skilled in the art will understand the probe tip 30 is propelled forcibly and rapidly toward the oxide coating 20 with sufficient force to cause the probe tip 30 to impart to the oxide coating a sufficient coating dissipating impact. By dissipating the oxide coating 20 the probe tip 30 comes into resting mechanical and electrical contact with the electrical contact 19 for testing purposes.

When used in the probe 23, the deflection device 37 can provide the probe tip 30 with a kinetic energy to facilitate the testing of an electrical circuit. The kinetic energy can exert a significant force upon the oxide coating 20 to penetrate the oxide coating 20. Much of this energy can be dissipated in the penetration of the oxide coating 20 so that the force exerted upon the contact point 19 is significantly reduced. Thus, the contact point 19 is not adversely affected by contact with the probe tip 30 and reprobing can be accommodated if desired. The deflection device 37 can be planarized to provide the probe tip 30 with the desired degree of kinetic energy at the planarizing position.

Although the deflection device of the present invention has been disclosed with particular reference to the probe 23, it is susceptible of many other applications which will now be obvious to those of ordinary skill in the art.

Referring now to FIG. 5, there is shown another testing apparatus 111 which is constructed in accordance with the best invention. The testing apparatus 111 is similar to testing apparatus 11 except that it includes a warp inhibited probe 23a. The probe 23a includes elements similar to those previously described with reference to probe 23 and such elements are designated with the same reference numeral followed by a lower case "a". Thus, the supporting structure is designated by the reference numeral 35a.

In this embodiment, the structure 35a is provided with an arm 65 extending in the direction of the deflection device 37a and in proximity thereto. The arm 65 provides a protection means or guard for the deflection device 37a and additionally provides a reference level for initially aligning the deflection device 37a with respect to the supporting structure 35a.

As in the case of the embodiment shown in FIG. 2, the deflection device 37a can be formed as a laminate including the structural member 55a, the crystal 41a, and the metallic layer 53a. In this particular embodiment of the deflection device 37a, a second crystal 67 similar to the crystal 41a can be disposed in contiguous relationship with the structural member 55a on the side thereof opposite the crystal 41a. A thin layer 69 of metal similar to the layer 53a can abe disposed on the outermost surface of the crystal 67 to facilitate the energizing of the crystal 67. Thus, the laminate forming the deflection device 37a of this particular embodiment has a crystal 41a and 67 and a layer of metal 53a and 69 symmetrically dispose outwardly from respective surfaces of the structural member 55a.

As in the previous embodiment of the deflection device 37, the source 47a can be connected to the metal layers 53a and 55a so that the crystal 41a oriented as previously discussed will deflect to a position 49a when the structural member 55 is positive with respect to the metal layer 53a. If the second crystal 67 is oriented in a reverse direction, in other words, with its side designated by a plus sign facing outwardly of the structural member 55a, the same potential introduced to the metal layer 53a can be introduced to the layer 69. Then even though the crystal 67 is reversed, the polarity of the signal impressed across its surfaces will also be reversed so that the crystal 67 will deflect in the same direction as the crystal 41a.

This embodiment of the deflection device 37a is particularly advantageous since it resists any warping of the crystals 41a and 67 which might occur with their deflection. For example, when the deflection device 37a bends from a normally straight position to the position 49a, the crystal 41a is placed in compression while the crystal 67 is placed in tension. These stresses tend to cancel each other to inhibit the warping of the deflection device 37a.

The supporting structure 35a may be advantageously molded from a material such as any suitable plastic. In such a molding process, the deflection device 37a may be embedded in the supporting structure 35 as shown in FIG. 5.

Considering now the operation of the testing apparatus ill in greater detail, the elongated metallic structural element 55a is resilient and flexible and is mounted cantilevered at one of its ends to position the probe tip 30a at its free end in a path of travel extending to the oxide coated contact 19. In this regard, when a signal of one polarity is applied to the structural elements 53a, 55a and 69, the piezoelectric devices 41a and 67 physically move to cause the structural element 55a to flex away from the oxide coated contact into tension as indicated in phantom lines in FIG. 6. In this cocked position, the element is resiliently stressed and held releasably in position by the piezoelectric devices.

When the signal abruptly changes its polarities, the piezoelectric devices 41a and 67 physically move oppositely to release the structural element 55a so that it snaps forcibly toward the oxide coated contact 19 and rapidly accelerates the probe tip 30a into striking engagement with the oxide coating with an oxide dissipating impact. The impact is sufficient to dissipate the oxide coating and thus to enable the tip to engage the contact mechanically and electrically.

As best seen in FIG. 5, the probe tip 30a can be configured as a blade 71 having portions which define a slot 73 for accepting the free end of the deflection device 37a. The portions of the slot 73 can extend to contact at least one of the metal layers 53a and 69.

Certainly, a primary advantage of the present invention is the excellent electrical contact the probe 23a provides with a particular contact point 19. However, once the contact is achieved, it is desirable to energize the probe tip 30a to perform the various test upon the chip 13 and its associated electric circuit 17. A further feature of the present invention is associated with the energizing of the probe tip 30a.

In FIG. 7, a top view of the deflection device 37a illustrates that the metal layer 69 can be separated by a score line 71 into a first portion 73 and a second portion 75. The first portion 73 of the layer 69 can be adapted to receive a signal from the source 47a on the conductors 48a and 50a, to provide for the deflection of the crystal 67 as previously described. The cutting of the score line 71 as well as the crystals 41 and 67 can be accomplished by an abrasive cutting method, such as sandblasting.

The second portion 75 of the layer 69 preferably is shaped to provide a conductor 77 extending from the rear of the deflection device 37a to the probe tip 30a. This will permit a signal to be introduced to the conductor 77 at the rear of the deflection device 37a to energize the probe tip 30a. The second portion 75 of the metal layer 69 can also define a second conductor 79 extending from the probe tip 30a to the rear of the deflection device 37a. This conductor 79 will provide at the rear of the deflection device 37a a voltage corresponding to the voltage at the probe tip 30a. The voltage on the conductor 79 can be introduced with an energizing signal into an operational amplifier 80. This means for energizing the probe tip 30a is particularly desirable since the conductor 79 provides a feedback loop for maintaining the voltage of the probe tip 30a at a substantially constant level. For low capacitance at the contact, miniature wires can be used. Further high density flex circuitry can be used to connect the probe tips to the test apparatus and fully isolate the probe drive from the circuit under test.

A bottom view of the deflection device 37a is illustrated in FIG. 8 where it will be noted that the metal layer 53a is provided with a score line 81 separating the layer 53a into a first portion 83 and a second portion 85. The first portion 83 is adapted to receive the signal from the source 47a on the conductor 48a to deflect the crystal 41a as previously discussed. The score line 81 is preferably disposed in close proximity to the probe tip 30a to maximize the size of the first portion 83 of the layer 53a. The score line 81 isolates the portions 85 from the portions 83 so that the energizing of the probe tip 30 does not interfere with the energizing of the crystal 41a.

A controller 87 for synchronizing the energizing of the deflection device 37a and the energizing of the probe tip 30a to perform various tests is illustrated generally in the block diagram of FIG. 10. The operation of the controller 87 begins by energizing an index time circuit 97 to provide a signal on a conductor 88. This signal on the conductor 88 can be used to move the chip 13 so that the particular contact point 19 is brought into proximity with the probe tip 30a.

An index delay 89 delays the signal on the conductor 88 for a time period, such as 50 milliseconds, corresponding to the time needed to index the chip 13. The delayed signal is introduced on a conductor 92 which provides an input to a probe down delay circuit 93. The circuit 93 provides a signal on a conductor 95 which provides an input to an up/down gate 99. This gate 99 can be an OR gate so that a signal on the conductor 95 is passed by the gate 99 and introduced to the deflection signal source 47a. The signal on the conductor 95 can also be introduced to the index time circuit 97 to inhibit any relative movement between the chip 13 and the probe tip 30a while the probe 23a is in the down position.

A source of potential 101 provides voltages of +VP and −VP which are introduced to the signal source 47a. A signal from the up/down gate 99 can be used by the signal source 47a to gate the negative reference potential −VP to the plurality of probes which are shown both pictorially and schematically at 23. The probes 23 can be oriented so that the negative reference potential −VP causes the deflection device 37a to deflect downwardly to provide electrical contact between the probe tip 30a and the particular contact point 19.

Once contact has been established between the probe tip 30a and the contact point 19, the testing of the electrical circuit 17 can begin. Thus, after a period of delay corresponding to the time needed to deflect the probe 23a to a down position, the probe down delay 93 can initiate a signal on a conductor 103 to activate a test time circuit 105. The circuit 105 can provide an output signal on the conductor 107 which can be introduced through the up/down gate 99 to the signal source 47. This signal from the gate 99 continues the energizing of the probes 23a with the negative reference potential −VP so that the probes 23a remain in the down position. The test time circuit 105 also provides a signal on the conductor 109 which starts the testing of the electrical circuit 17 in accordance with the test procedure.

A test delay circuit 111 delays the signal on the conductor 109 a period of time, such as 50 milliseconds, corresponding to the time needed to test the circuit 17. After this period of delay, a signal from the circuit 111 can be introduced onto a conductor 113 to indicate that the test has been completed. The conductor 113 can provide an input to a probe up delay circuit 115 which provides a signal on a conductor 117 to inhibit the test time circuit 105. In the preferred embodiment, this signal on the conductor 117 causes the signal on the conductor 107 to cease so that the signal source 47a no longer receives a signal from the up/down gate 99. Under these circumstances, the signal source 47a can introduce the positive reference potential +VP to the probes 23a. The positive reference potential +VP will cause the deflection device 37a to raise the probe tip 30a to an up position removed from the contact point 19.

After a period of delay associated with the time used to raise the probe tip 30a, the probe up delay circuit 115 can provide a signal on a conductor 119. With the probe 23a in the up position, a signal on a conductor 119 can be introduced to the index time circuit 97, which provides a signal on the conductor 88 so that the chip 13 is again moved relative to the probe 23a.

In this preferred embodiment of the controller 86, the probe down and probe up delay circuits 93 and 115 can be of a type commonly designated in the electronics industry with the circuit number 74123. Similarly, the test time and index time circuits 105 and 97 can be of the type commonly designated in the industry with the number 7474. Similarly, the up/down gate 99 can be a 7440 circuit while the test and index delay circuits 111 and 99, respectively, can be 74/23 circuits. These circuits 93, 105, 97, 99, 111 and 89 are marketed by many component manufacturers including Texas Instruments.

As noted, the deflection device 37a will deflect a distance corresponding to the magnitude of the energizing signal provided by the source 47a. This feature of the present invention can be relied upon to planarize the probes 23a. For example, a switch 121 can be provided in the source of potential 101 to introduce to the source 47a a planarizing potential, such as −VP/2, having a lesser magnitude than the negative potential −VP. Then during the planarizing of the probes 23a, this reduced negative potential can provide a lesser deflection of the deflection device 37a. The probe tip 30a can then be mechanically adjusted to some reference level. For example, in the preferred embodiment, the probe tip 30a can be mechanically adjusted to merely touch the surface of the oxide coating 20, as shown by the position 59 illustrated in FIG. 4. It follows that if the reduced negative reference potential deflects the probe tip 30a to the position 59, then the negative reference potential of normal magnitude −VP can provide the probe tip 30a with additional kinetic energy for penetrating the oxide coating 20. Furthermore, the magnitude of the planarizing potential can be varied to provide a desired degree of kinetic energy at the position 59. The magnitude of the normal reference potential minus the planarizing potential will correspond to the kinetic energy at the planarizing position, such as the position 59.

As previously discussed, an abrupt change in the magnitude of the signal provided by the source 47a can cause the deflection device 37 to oscillate so that the probe tip 30a bounces on the contact point 19. Under some circumstances, this may be objectionable so that it becomes desirable to shape the signal of the source 47a to inhibit abrupt changes in its magnitude. For example, referring to FIG. 9, it will be noted that the edges of a generally square pulse 86 can be sloped so that an energizing sinal, such as 150 volts, does not rapidly change in magnitude to a level, such as −150 volts.

It has been found that the deflection device 37a can be of particular advantage in shaping the energizing signal provided by the source 47a to inhibit the oscillations of the deflection device 37a. For example, it has been found that the crystals 41a and 67 in the deflection device 37a provide a capacitance which can be connected in series with a resistance 123 to provide an integrating network for sloping the sides of a typically square wave signal provided by the signal source 47a. In such an embodiment, the crystals 41a and 67 can provide a capacitance of 0.05 microfarads and the resistance 123 can have a value of 200 K. Such an integrating network can provide the energizing voltage with a waveform, such as that of FIG. 9, wherein a change in magnitude of 300 volts is accomplished in more than 1 millisecond. In this manner, the energizing signal, such as that shown in FIG. 9, can be shaped so that it does not contain frequency components corresponding to the fundamental frequency of the deflection device 37a. This inhibits the oscillations of the deflection device 37a and hence the bouncing of the probe tip 30a.

From the foregoing disclosure, it is apparent that with a minimum of structure, a deflection device can be made which has characteristics for deflecting in response to both positive and negative potentials. The direction of the deflection can be related to the polarity of the energizing signal, and the degree of deflection can be related to the magnitude of the energizing signal. An embodiment of the deflection device 37a including a pair of crystals 41a and 67 can inhibit any warping of the deflection device resulting from the energizing thereof.

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. An electrical testing apparatus for enabling an oxide coated electrical contact to be tested, comprising:

an elongated structural element extending in a cantilevered manner at one of its ends for movement toward and away from the oxide coated electrical contact, said elongated structural element having first and second surfaces, a free end and a fixed end;

a probe tip mounted at said free end of said elongated structural element and having a piercing section configured to penetrate the oxide coating of the electrical contact to be tested;

a first piezoelectric crystal layered on said first surface of said elongated structural element and having piezoelectric characteristics for deflecting toward the oxide coated electrical contact; and a second piezoelectric crystal layered on said second surface of said elongated structural element and having piezoelectric characteristics for deflecting;

wherein deflection of at least said first piezoelectric crystal in response to at least one electrical signal causes said elongated structural element to flex toward the oxide coated electrical contact and thereby propels said probe tip into the oxide coating of the electrical contact with sufficient kinetic energy for penetrating the oxide coating.

2. The electrical testing apparatus of claim 1, wherein said second piezoelectric crystal is arranged to cock said elongated structural element in a second direction away from the oxide coated electrical contact in response to another electrical signal.

3. The electrical testing apparatus of claim 1, wherein said probe tip includes a blade.

4. The electrical testing apparatus of claim 1, further comprising a signal source coupled to said first piezoelectric crystal.

5. The electrical testing apparatus of claim 4, further comprising a thin elongated conductive plate layered on said first piezoelectric crystal and coupled to said signal source.

6. A method of enabling an oxide coated electrical contact to be tested utilizing an electrical testing apparatus having an elongated structural element extending in a cantilevered manner at one of its ends for movement toward and away from the oxide coated electrical contact, said elongated structural element having first and second surfaces, a free end and a fixed end; a probe tip mounted at said free end of said elongated structural element and having a piercing section configured to penetrate the oxide coating of the electrical contact to be tested; a first piezoelectric crystal layered on said first surface of said elongated structural element and having piezoelectric characteristics for deflecting in a first direction toward the oxide coated electrical contact; and a second piezoelectric crystal layered on said second surface of said elongated structural element and having piezoelectric characteristics for deflecting; the method comprising:

applying an electrical signal to at least the first piezoelectric crystal thereby causing at least the first piezoelectric crystal to deflect in the first direction thereby causing the elongated structural element to flex toward the oxide coated electrical contact; and striking the oxide coating of the electrical contact with the probe tip, the probe tip having sufficient kinetic energy to penetrate the oxide coating and establish a mechanical and electrical connection between the probe tip and the electrical contact.

7. The method of claim 6, further comprising:

applying an electrical signal to at least said second piezoelectric crystal thereby causing at least the second piezoelectric crystal to deflect in a second direction away from said oxide coated electrical contact so as to cock said elongated structural element.

8. The method of claim 7, further comprising applying an electrical signal to said electrical contact via the probe tip after the mechanical and electrical connection between the probe tip and the electrical contact have been established.

* * * * *